(12) United States Patent
Kim et al.

(10) Patent No.: US 8,508,450 B2
(45) Date of Patent: Aug. 13, 2013

(54) ARRAY SUBSTRATE AND DISPLAY PANEL HAVING THE SAME

(75) Inventors: Beom-Jun Kim, Seoul (KR); Hee-Joon Kim, Cheonan-si (KR); Hong-Woo Lee, Cheonan-si (KR); Hye-Rhee Han, Suwon-si (KR); Hyeong-Jun Park, Cheonan-si (KR); Jin-Suk Seo, Cheonan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1191 days.

(21) Appl. No.: 12/043,308

(22) Filed: Mar. 6, 2008

(65) Prior Publication Data
US 2008/0303760 A1 Dec. 11, 2008

(30) Foreign Application Priority Data

Jun. 7, 2007 (KR) .............................. 10-2007-55590

(51) Int. Cl.
  *G09G 3/38* (2006.01)
  *G02F 1/136* (2006.01)
  *G02F 1/1343* (2006.01)
(52) U.S. Cl.
  USPC .................. 345/92; 345/87; 349/42; 349/141

(58) Field of Classification Search
  USPC .......................... 345/87, 92; 349/42–49, 141
  See application file for complete search history.

(56) References Cited

U.S. PATENT DOCUMENTS

| | | | | |
|---|---|---|---|---|
| 6,288,763 | B1 * | 9/2001 | Hirota | 349/141 |
| 2003/0179325 | A1 * | 9/2003 | Rho et al. | 349/43 |
| 2006/0097971 | A1 * | 5/2006 | Lee et al. | 345/89 |

FOREIGN PATENT DOCUMENTS

| | | |
|---|---|---|
| JP | 2000-206904 | 7/2000 |
| JP | 2003-075869 | 3/2003 |
| KR | 1020060116878 | 11/2006 |

* cited by examiner

*Primary Examiner* — Srilakshmi K Kumar
(74) *Attorney, Agent, or Firm* — F. Chau & Associates, LLC

(57) ABSTRACT

An array substrate of an LCD having: a gate line formed along a first direction; a data line formed along a second direction crossing the first direction; first and second pixel electrodes spaced apart from each other; a thin-film transistor includes a gate electrode connected to the gate line; a source electrode connected to the data line and partially overlapping the second pixel electrode; and a drain electrode connected to the first pixel electrode spaced apart from the second pixel electrode along the second direction. The source electrode or the gate electrode overlaps the second pixel electrode but the drain electrode does not overlap the second pixel electrode. Electrical coupling between the first and second pixel electrodes are avoided with such configuration.

19 Claims, 9 Drawing Sheets

ARRAY SUBSTRATE AND DISPLAY PANEL HAVING THE SAME

CROSS-REFERENCE TO RELATED APPLICATION

This application claims priority under 35 U.S.C. §119 to Korean Patent Application No. 2007-55590 filed on Jun. 7, 2007 in the Korean Intellectual Property Office (KIPO), the contents of which are herein incorporated by reference in their entirety.

BACKGROUND OF THE INVENTION

1. Technical Field

The present invention relates to an array substrate, a display panel having the array substrate and a method for manufacturing the array substrate, and more particularly, to an array substrate capable of enhancing a display quality of an image.

2. Discussion of the Related Art

A liquid crystal display (LCD) device includes an LCD panel with liquid crystal molecules and a backlight. Images are displayed by control of the liquid crystal molecules to pass or block the transmission of light generated by the back light.

The LCD panel includes an array substrate, an opposite substrate and a liquid crystal layer. The array substrate includes a plurality of gate lines and signal lines, a plurality of thin-film transistors (TFTs) and a plurality of pixel electrodes. The opposite substrate faces the array substrate. The liquid crystal layer is interposed between the array substrate and the opposite substrate.

The gate lines are formed along a first direction. The data lines are formed along a second direction, substantially perpendicular to the first direction. Each TFT is electrically connected to a gate line and a data line. The pixel electrode formed in a unit area is electrically connected to the TFT. The pixel electrode is arranged in a matrix along the first and second directions.

A TFT that is electrically connected to a first pixel electrode may overlap a second pixel electrode adjacent to the first pixel electrode. In such case, a voltage applied to the second pixel electrode affects a voltage charged in the first pixel electrode through the overlapping TFT. This coupling characteristic may cause a horizontal line defect that can be visible on a display image.

SUMMARY OF THE INVENTION

Embodiments of the present invention provide an array substrate capable of enhancing a display quality of an image by decreasing the coupling defect between pixel electrodes, a display panel having the array substrate, and a method for manufacturing the array substrate.

In an exemplary embodiment of the present invention, an array substrate includes a gate line, a data line, first and second pixel electrodes, and a thin-film transistor (TFT).

The gate line is formed along a first direction. The data line is formed along a second direction crossing the first direction. The first and second pixel electrodes are spaced apart from each other. The TFT includes a gate electrode electrically connected to the gate line, a source electrode electrically connected to the data line and partially overlapping the second pixel electrode, and a drain electrode electrically connected to the first pixel electrode and spaced apart from the second pixel electrode along the second direction.

In an exemplary embodiment, the drain electrode may include a pixel overlapping part and a drain extending part. The pixel overlapping part overlaps the first pixel electrode to be electrically connected to the first pixel electrode. The drain extending part is extended to the second direction from the pixel overlapping part to face the source electrode.

In an exemplary embodiment, an extending length of the drain extending part may be longer than a distance between the first and second pixel electrodes. An overlap avoiding portion for receiving an end portion of the drain extending part may be formed at a first end portion of the second pixel electrode facing the first pixel electrode. In another exemplary embodiment, an extending length of the drain extending part is shorter than a distance between the first and second pixel electrodes.

In an exemplary embodiment of the present invention, an array substrate includes a gate line, a data line, first and second pixel electrodes, and a TFT. The gate line is formed along a first direction. The data line is formed along a second direction crossing the first direction. The first and second pixel electrodes are spaced apart from each other along the second direction.

The TFT includes a gate electrode electrically connected to the gate line, a source electrode electrically connected to the data line, and a drain electrode electrically connected to the first pixel electrode and spaced apart from the second pixel electrode along the second direction, the TFT partially overlapping the second pixel electrode. For example, a portion of the gate line of the TFT may partially overlap the second pixel electrode.

In an exemplary embodiment of the present invention, an array substrate includes a gate line, a data line, a TFT, a first pixel electrode, and a second pixel electrode. The gate line is formed along a first direction. The data line is formed along a second direction crossing the first direction. The TFT is electrically connected to the gate line and the data line. The first pixel electrode is electrically connected to a drain electrode of the TFT. The second pixel electrode is spaced apart from the first pixel electrode along the second direction and having an overlap avoiding portion formed thereon, the overlap avoiding portion spaced apart from the TFT to receive the TFT. For example, the gate is line may partially overlap the second pixel electrode.

In an exemplary embodiment of the present invention, a display panel includes an array substrate, an opposite substrate opposite to the array substrate, and a liquid crystal layer interposed between the array substrate and the opposite substrate.

The array substrate includes a gate line, a data line, first and second pixel electrodes, and a thin-film transistor (TFT). The gate line is formed along a first direction. The data line is formed along a second direction crossing the first direction. The first and second pixel electrodes are spaced apart from each other. The TFT includes a gate electrode electrically connected to the gate line, a source electrode electrically connected to the data line and partially overlapping the second pixel electrode, and a drain electrode electrically connected to the first pixel electrode and spaced apart from the second pixel electrode along the second direction.

According to the exemplary embodiment, even though the source electrode or the gate electrode overlaps the second pixel electrode, the drain electrode does not overlap the second pixel electrode, so that a coupling between the first and second pixel electrodes may be prevented from generating so that a display quality may be enhanced.

BRIEF DESCRIPTION OF THE DRAWINGS

Exemplary embodiments of the present invention can be understood in more detail from the following descriptions taken in conjunction with the accompanying drawings, in which.

DESCRIPTION OF EXEMPLARY EMBODIMENTS

The invention is described more fully hereinafter with reference to the accompanying drawings, in which embodiments of the invention are shown. This invention may, however, be embodied in many different forms and should not be construed as limited to the embodiments set forth herein.

Figure 1:
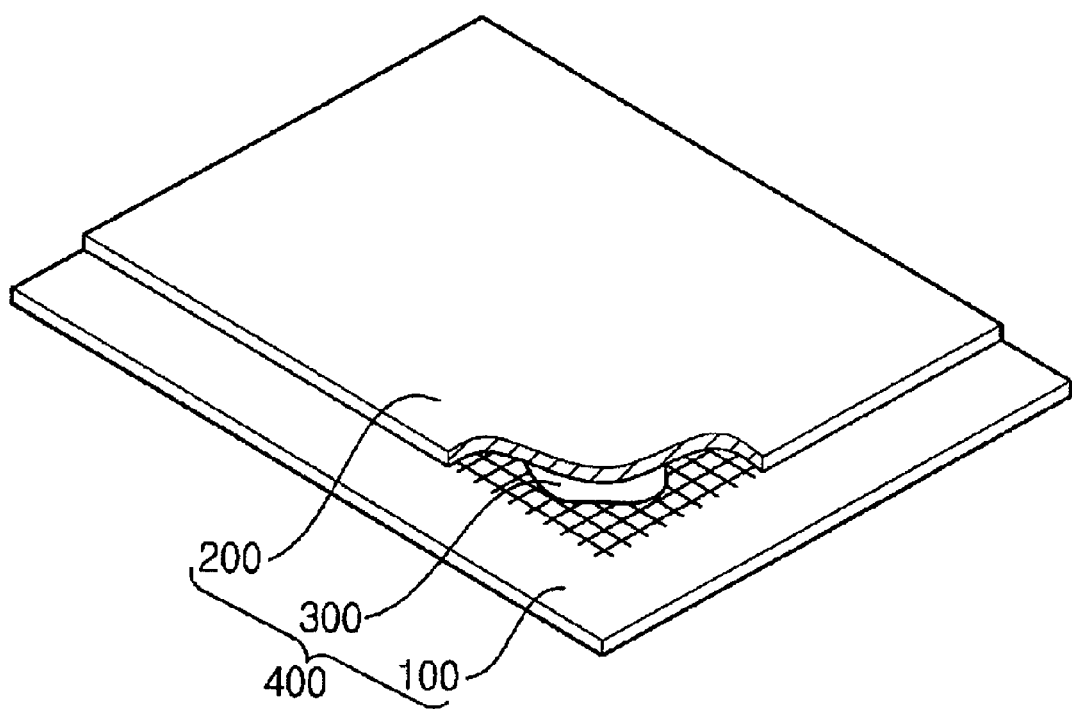
FIG. 1 is a perspective view illustrating a display panel according to an exemplary embodiment of the present invention.

FIG. 1 is a perspective view illustrating a display panel 400 according to an exemplary embodiment of the present invention.

Referring to FIG. 1, a display panel 400 according to an exemplary embodiment of the present invention includes an array substrate 100, an opposite substrate 200, and a liquid crystal layer 300.

The array substrate 100 includes a plurality of pixel electrodes disposed in a matrix, a plurality of thin-film transistors TFTs applying a driving voltage to each of the pixel electrodes, and a plurality of signal lines for driving the TFTs.

The opposite substrate 200 faces the array substrate 100. The opposite substrate 200 may include, for example, a common electrode. The common electrode may include, for example, an optically transparent and electrically conductive material. The opposite substrate 200 may further include a plurality of color filters formed in correspondence with the pixel electrodes. The color filters may include, for example, a plurality of red color filters, a plurality of green color filters and a plurality of blue color filters. In an exemplary embodiment, the color filters are formed on the opposite substrate 200. In another exemplary embodiment, the color filters are formed on the array substrate 100.

The liquid crystal layer 300 is interposed between the array substrate 100 and the opposite substrate 200. An electric field is applied to the liquid crystal layer 300 to control the orientation of liquid crystal molecules of the liquid crystal layer 300 to alter optical transmissivity, and to display an image.

Figure 2:
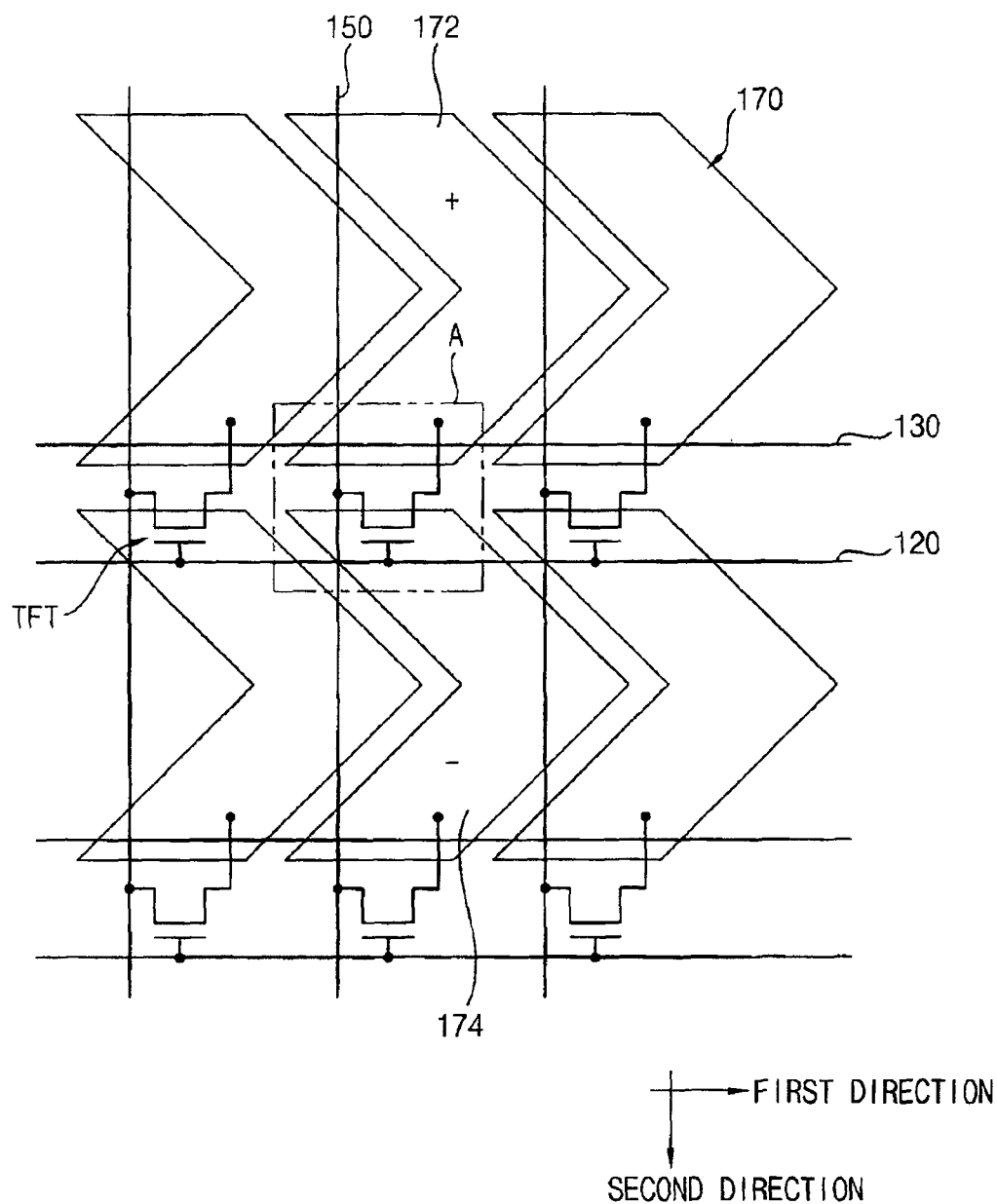
FIG. 2 shows a portion of the array substrate of FIG. 1.

FIG. 2 is a plan view schematically illustrating a portion of the array substrate 100 of FIG. 1.

Referring to FIGS. 1 and 2, the array substrate 100 includes a gate line 120, a storage line 130, a data line 150, a thin-film transistor (TFT), and a pixel electrode 170.

The gate lines 120 are formed along a first direction. The storage line 130 is spaced apart from the gate line 120 to be formed along the first direction. The data lines 150 are formed along a second direction crossing the first direction. The second direction may be substantially perpendicular to the first direction.

The TFT is electrically connected to the gate line 120 and the data line 150. The TFTs may be formed in a crossing area where the gate lines 120 and the data lines 150 cross each other.

The pixel electrodes 170 are electrically connected to corresponding TFTs. The pixel electrode 170 overlaps a portion of the storage line 130. The pixel electrode 170 may have an overlapping shape where the pixel electrode 170 overlaps the data line 150. In an exemplary embodiment, the pixel electrode 170 has a bent shape at an angle of about 90 degrees. In another exemplary embodiment, the bents of the pixel electrode 170 form a V-shape.

A pair of pixel electrodes 170 adjacent to the second direction of the pixel electrodes 170 will be referred to as a first pixel electrode 172 and a second pixel electrode 174. The first and second pixel electrodes 172 and 174 are spaced apart from each other along the second direction.

The first pixel electrode 172 is electrically connected to the TFT to receive a pixel voltage from the TFT. The second pixel electrode 174 overlaps a portion of the gate line 120. The second pixel electrode 174 may overlap a portion of the TFT, and a gap that exist between the first and second pixel electrodes 172 and 174. This gap may be narrowed.

The first pixel electrode 172 receives a first voltage from the TFT overlapping a portion of the second pixel electrode 174. The second pixel electrode 174 receives a second voltage that may be different from the first voltage from another TFT overlapping a portion of another pixel electrode 170 adjacent along the second direction.

The first and second voltages may be different at different voltage potential or at different polarity from each other. Since the TFT overlaps a portion of the second pixel electrode 174, when the second voltage is applied to the second pixel electrode 174, the second voltage may affect the first voltage charged in the first pixel electrode 172.

When the first voltage and the second voltage are a positive voltage and a negative voltage, respectively, the second voltage may decrease due to the first voltage charged in the first pixel electrode 172.

Figure 3:
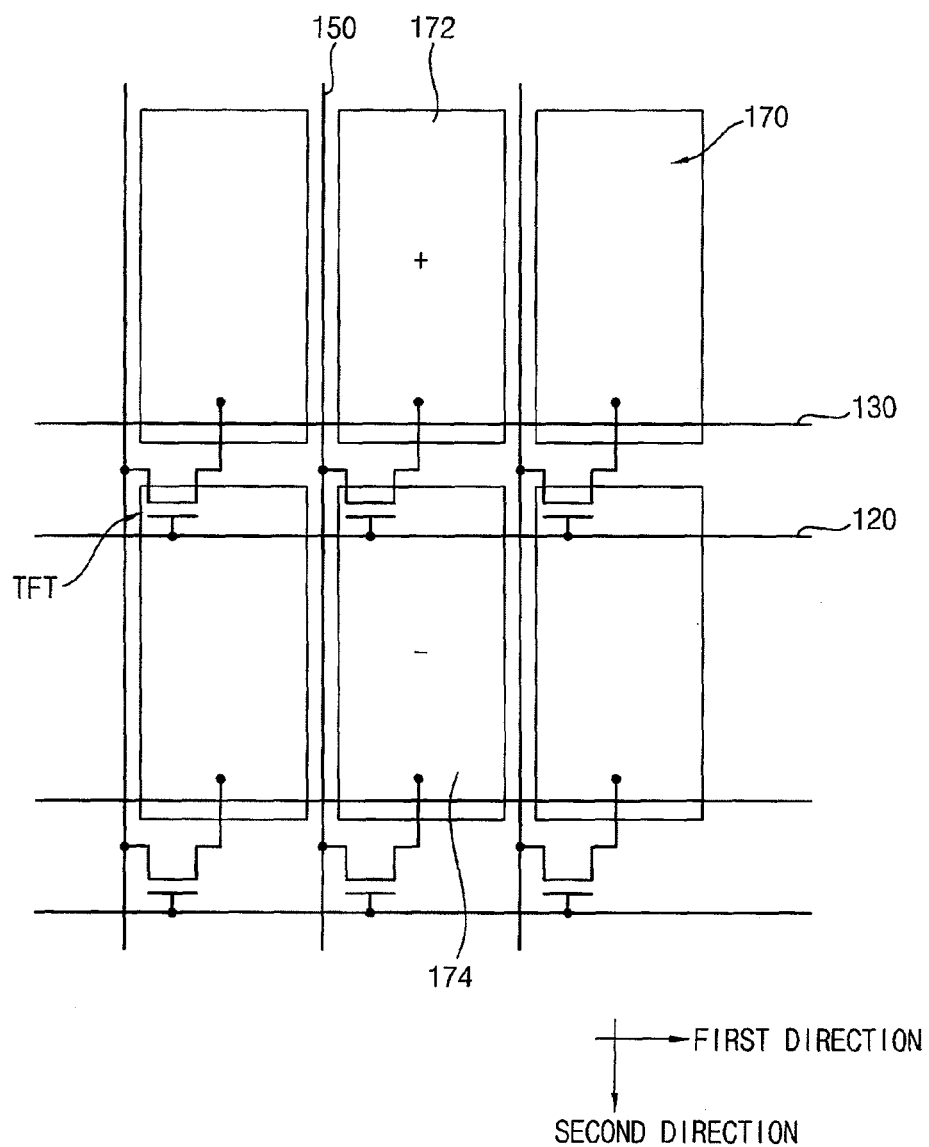
FIG. 3 shows a portion of the array substrate according to an exemplary embodiment of the present invention.

FIG. 3 is a plan view schematically illustrating a portion of the array substrate according to an exemplary embodiment of the present invention.

Referring to FIG. 3, the pixel electrode 170 may have a rectangular shape when viewed on a plane.

In an exemplary embodiment, the gate lines 120 and the data lines 150 are crossed with each other to form a plurality of unit areas. The unit areas may have a rectangular shape that a length of the second direction is longer than that of the first direction. The pixel electrodes 170 are formed in the unit areas, respectively. The pixel electrode 170 may have a rectangular shape similar to the unit area.

Figure 4:
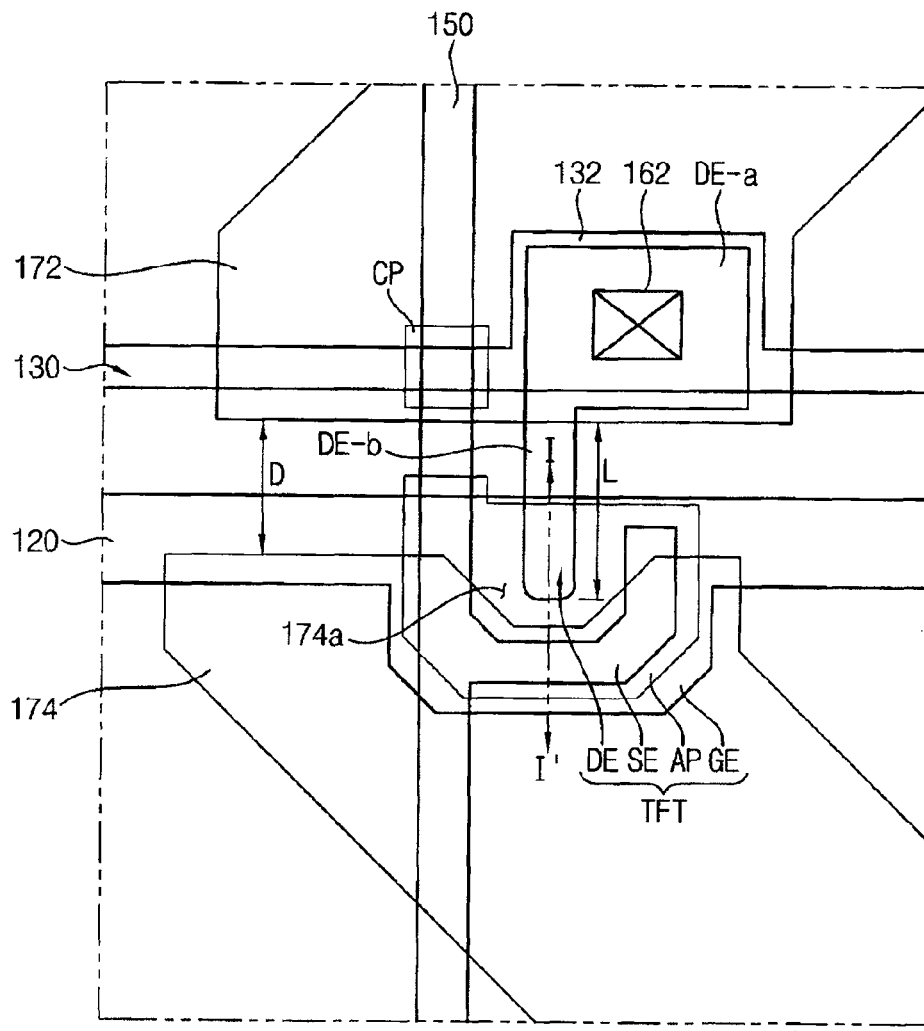
FIG. 4 is an enlarged plan view illustrating a portion "A" according to a first exemplary embodiment in FIG. 2.
Figure 5:
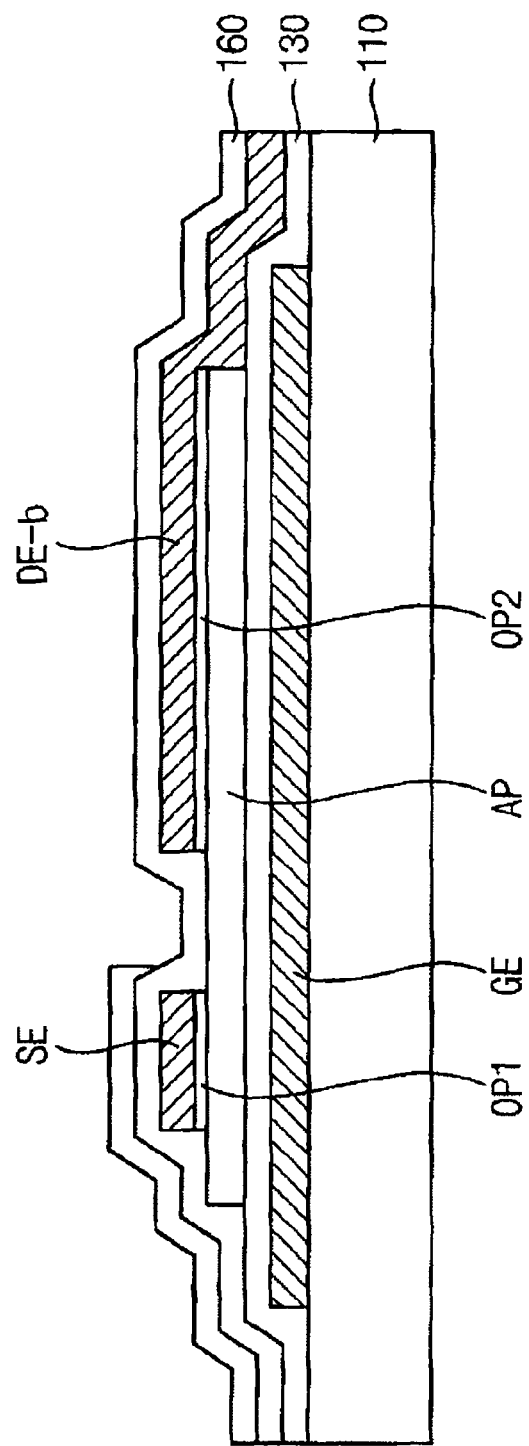
FIG. 5 is a cross-sectional view taken along a line I-I' of FIG. 3.

FIG. 4 is an enlarged plan view illustrating a portion "A" according to a first exemplary embodiment in FIG. 2, and FIG. 5 is a cross-sectional view taken along a line I-I' of FIG. 3.

Referring to FIGS. 4 and 5, the array substrate includes a base substrate 110, a gate line 120, a storage line 130, a gate insulation layer 140, a data line 150, a passivation layer 160, a first pixel electrode 172, a second pixel electrode 175, and a thin-film transistor (TFT).

The base substrate 110 includes a plate shape. The base substrate 110 includes a transparent material such as glass, quarts, synthetic resin, etc.

The gate lines 120 are formed on the base substrate 110 in the first direction. The storage line 130 is formed on the base substrate 110 to be spaced apart from the gate line 120 along the first direction.

The gate insulation layer 140 is formed on the base substrate 110 where the gate line 120 and the storage line 130 are formed thereon. The gate insulation layer 140 may include, for example, an inorganic insulation material. The gate insulation layer 140 may include, for example, a silicon nitride layer (SiNx) or a silicon oxide layer (SiOx).

The data line 150 is formed on the gate insulation layer 140 along the second direction. The passivation layer 160 is formed on the gate insulation layer 140 where the data line 150 is formed thereon. The passivation layer 160 may include, for example, a silicon nitride layer (SiNx) or a silicon oxide layer (SiOx).

The first and second pixel electrodes 172 and 174 may include, for example, a transparent conductive material. The first and second pixel electrodes 172 and 174 are formed on the passivation layer 160 to be spaced apart from each other along the second direction.

The first pixel electrode 172 is formed to overlap a portion of the storage line 130. In an exemplary embodiment, a lower portion of the first pixel electrode 172 facing the second pixel electrode 174 may overlap a portion of the storage line 130.

The second pixel electrode 174 is spaced apart from the first pixel electrode 172 by a distance D along the second direction. The second pixel electrode 174 overlaps a portion of the TFT. In an exemplary embodiment, an upper portion of the second pixel electrode 174 facing the first pixel electrode 172 may overlap a portion of the TFT. The upper portion of the second pixel electrode 174 may overlap at least a portion of the gate line 120.

The TFT includes a gate electrode GE, an activation pattern AP, a source electrode SE and a drain electrode DE. The TFT may further include a first ohmic pattern OP1 and a second ohmic pattern OP2. The passivation layer 160 covers and protects the TFT.

The gate electrode GE is extended from the gate line 120 along the second direction. The gate electrode GE is not extended from the gate line 120, and may be formed by a portion of the gate line 120.

The activation pattern AP overlaps the gate electrode GE to be formed on the gate insulation layer 140. The activation pattern AP may be formed to cover a cross area where the gate line 120 and the data line 150 cross each other.

The source electrode SE is formed on the activation pattern AP. The source electrode SE is extended from the data line 150 along the first direction. In an exemplary embodiment, the source electrode SE may have a U-shape or a J-shape when viewed on a plane.

The drain electrode DE is spaced apart from the source electrode SE to overlap a portion of the activation pattern AP, and overlaps a portion of the first pixel electrode 172 to be electrically connected to the first pixel electrode 174.

The first ohmic pattern OP1 is formed between the source electrode SE and the activation pattern AP to decrease a contact resistance between the source electrode SE and the activation pattern AP. The second ohmic pattern OP2 is formed between the drain electrode DE and the activation pattern AP to decrease a contact resistance between the drain electrode DE and the activation pattern AP. In an exemplary embodiment, the activation pattern AP may include, for example, amorphous silicon (a-Si), and the first and second ohmic patterns OP1 and OP2 may include, for example, n+ amorphous silicon (n+ a-Si). In an exemplary embodiment, n+ impurities are implanted into the amorphous silicon layer (a-Si) at a high concentration to form the first and second ohmic patterns OP1 and OP2.

In an exemplary embodiment, the activation pattern AP may be formed between the data line 150 and the gate insulation layer 140. In another exemplary embodiment, the activation pattern AP may be not formed between the data line 150 and the gate insulation layer 140.

An additional organic insulation layer (not shown) may be further formed on the passivation layer 160. The organic insulation layer may further include the color filter.

A crossing area cover pattern CP may be formed between the storage line 130 and the data line 150. In an exemplary embodiment, the crossing area cover pattern CP is formed on the gate insulation layer 140 to cover an area where the storage line 130 and the data line 150 cross each other. The crossing area cover pattern CP may include the same material as that of the activation pattern AP. The crossing area cover pattern CP may be formed through the same manufacturing process as that of the activation pattern AP.

The drain electrode DE includes a pixel overlapping part DE-a, and a drain extending part DE-b.

The pixel overlapping part DE-a overlaps a portion of the first pixel electrode 172 to be electrically connected to the first pixel electrode 172. For example, a contact hole 162 for electrically connecting the first pixel electrode 172 to the pixel overlapping part DE-a is formed on the passivation layer 160. For example, the pixel overlapping part DE-a may have a rectangular shape when viewed on a plane.

The storage line 130 includes a drain overlapping part 132 corresponding to the pixel overlapping part DE-a. The drain overlapping part 132 and the pixel overlapping part DE-a are spaced apart by the gate insulation layer 140 to form a storage capacitor.

The drain extending part DE-b is extended from the pixel overlapping part DE-a along the second direction to overlap a portion of the activation pattern AP. In an exemplary embodiment, a lower portion of the drain extending part DE-b facing the second pixel electrode 174 is spaced apart from the source electrode SE along the second direction. A lower portion of the drain extending part DE-b is spaced apart from the second pixel electrode 174 along the second direction not to overlap the second pixel electrode 174.

An extending length L of the drain extending part DE-b is greater than or equal to a distance D between the first and second pixel electrodes 172 and 174. The extending length L of the drain extending part DE-b denotes a straight distance from a lower portion of the first pixel electrode 172 facing the second pixel electrode 174 to a lower portion of the drain extending part DE-b.

As the extending length L is greater than or equal to the distance D, to prevent the drain extending part DE-b from overlapping the second pixel electrode 174, an overlap avoiding portion 174a may be formed on an upper portion of the second pixel electrode 174. In an exemplary embodiment, the overlap avoiding portion 174a may have an equilateral trapezoidal shape when viewed on a plane.

The second pixel electrode 174 overlaps a portion of the TFT and a portion of the gate line 120. In an exemplary embodiment, the second pixel electrode 174 overlaps at least a portion of the source electrode SE. A portion of the second pixel electrode 174 formed at an adjacent location to the overlap avoiding portion 174a overlaps at least a portion of the source electrode SE.

Figure 6:
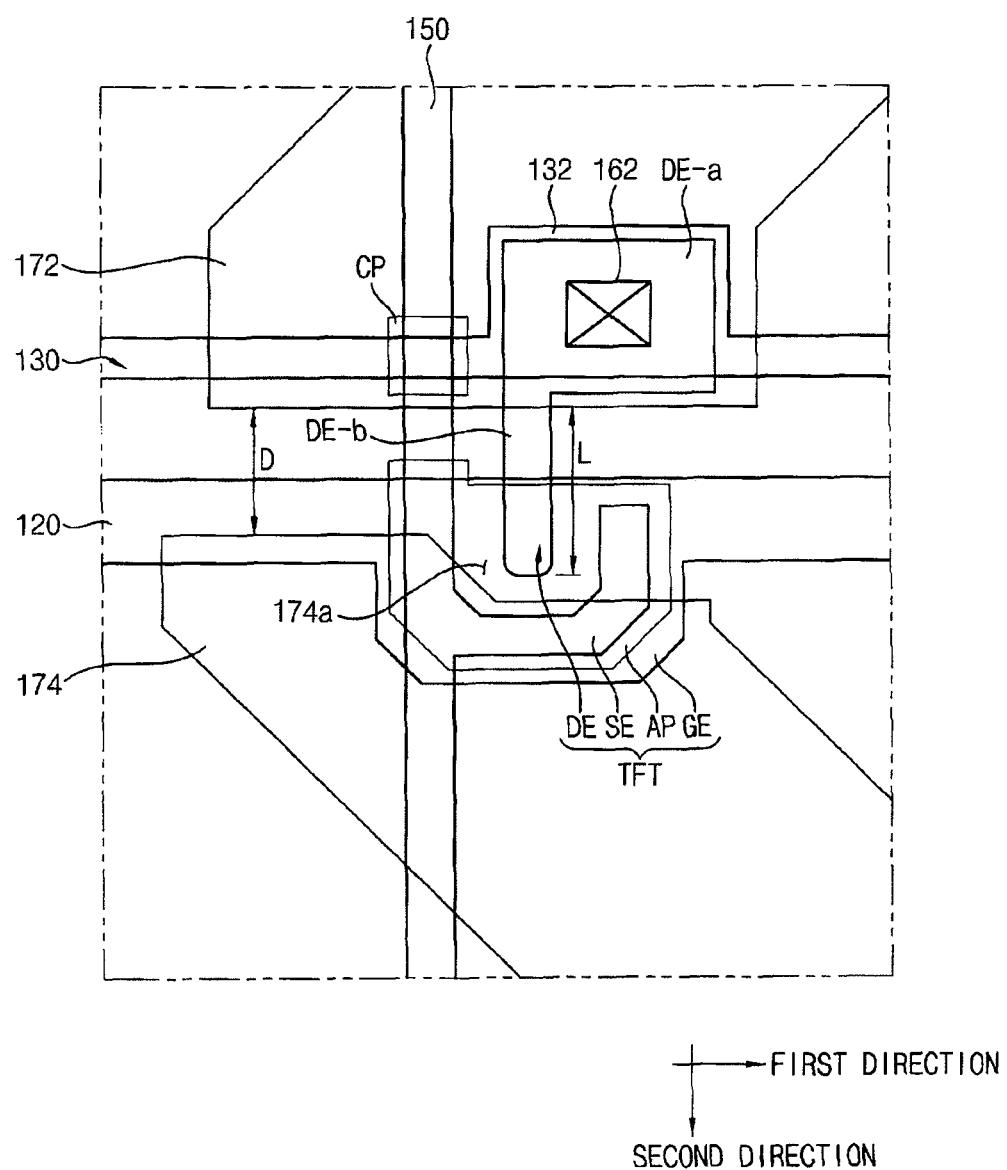
FIG. 6 is an enlarged plan view illustrating a portion "A" according to another exemplary embodiment in FIG. 2.

FIG. 6 is an enlarged plan view illustrating a portion "A" according to a second exemplary embodiment in FIG. 2. The second pixel electrode having a different shape from that of FIG. 4 in the array substrate will be described.

Referring to FIG. 6, the overlap avoiding portion 174a formed in the second pixel electrode 174 may have an opening shape unlike that in FIG. 4.

Here, even though the overlap avoiding portion 174a may have an opening shape, the second pixel electrode 174 overlaps at least a portion of the source electrode SE, and overlaps a portion of the gate line 120.

The array substrate of FIG. 6 is same as the array substrate of FIGS. 4 and 5 except the above described. Thus, the same reference numerals will be used to refer to the same or like parts as those described in FIG. 6 and any further explanation concerning the above elements will be omitted.

Figure 7:
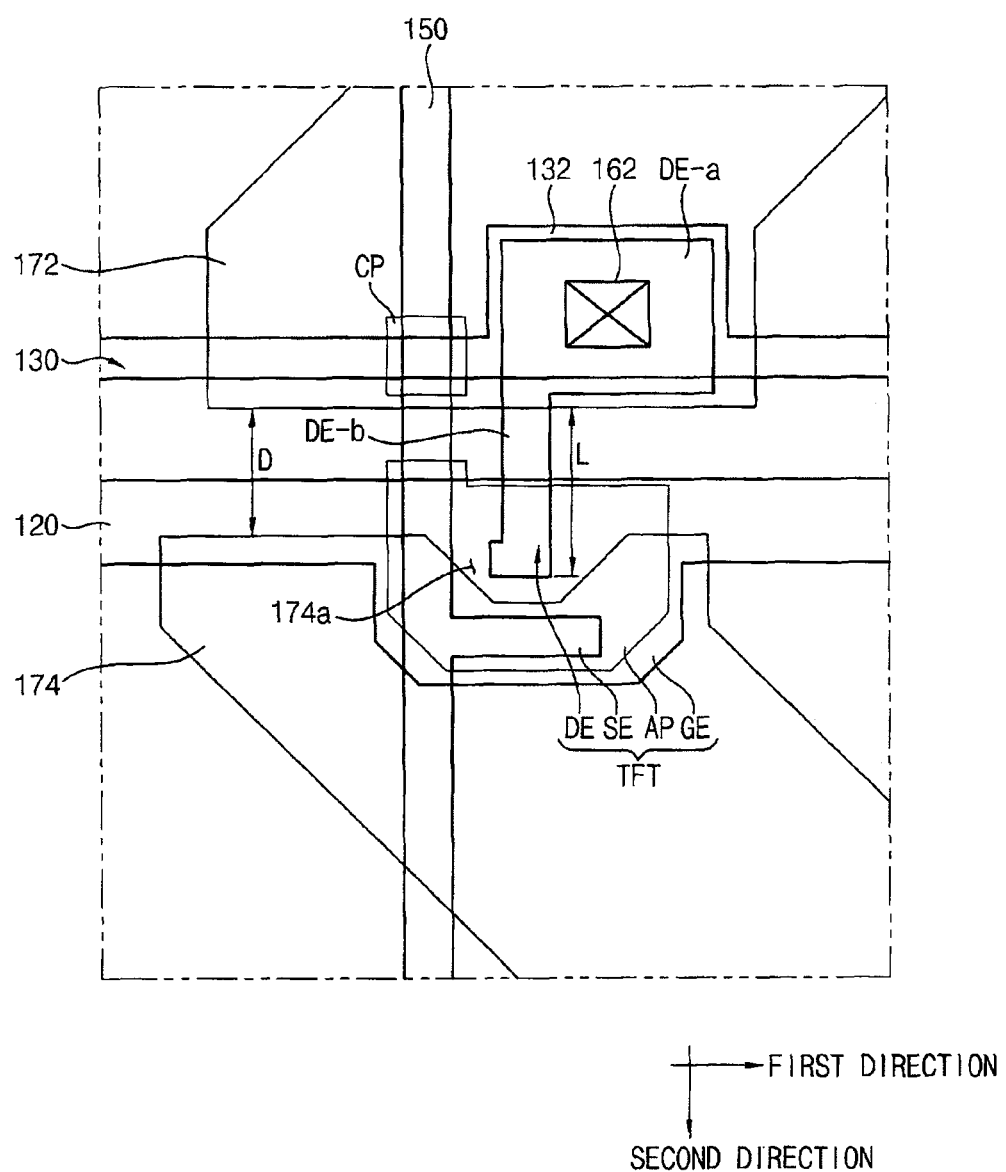
FIG. 7 is an enlarged plan view illustrating a portion "A" according to another exemplary embodiment in FIG. 2.

FIG. 7 is an enlarged plan view illustrating a portion "A" according to a third exemplary embodiment in FIG. 2. The TFT having a different shape from that of FIG. 4 in the array substrate will be described.

Referring to FIG. 7, the TFT may have a different shape unlike that of FIG. 4. In an exemplary embodiment, the gate electrode GE and the activation pattern AP have the same shape like those of FIG. 4, however, the source electrode SE and the drain electrode DE have the different shape unlike those of FIG. 4.

The source electrode SE is extended from the data line 150 along the first direction to overlap the activation pattern AP.

A first end portion of the drain extending part DE-a facing the source electrode SE is spaced apart from the source electrode SE along the second direction to overlaps the activation pattern AP. The first end portion of the drain extending part DE-a has an extending shape along the first direction.

Even though the TFT has the different shape unlike that of FIG. 4, the second pixel electrode 174 overlaps at least a portion of the source electrode SE, and overlaps a portion of the gate line 120.

When the extending length L is greater than the distance D, to prevent the drain extending part DE-b from overlapping the second pixel electrode 174, an overlap avoiding portion 174a may be formed on an upper portion of the second pixel electrode 174.

The array substrate of FIG. 7 is same as the array substrate of FIGS. 4 and 5 except the above described. Thus, the same reference numerals will be used to refer to the same or like parts as those described in FIG. 6 and any further explanation concerning the above elements will be omitted.

Figure 8:
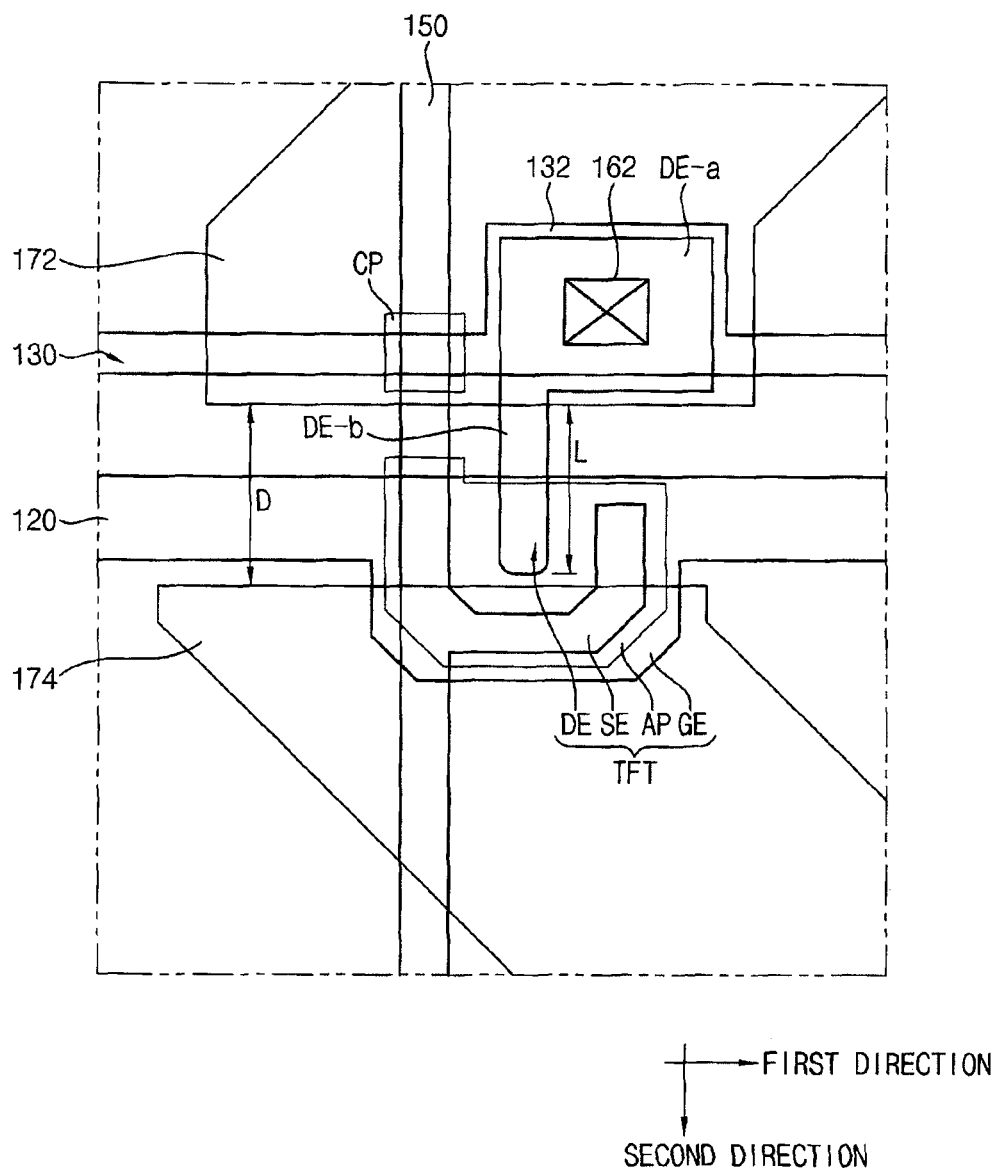
FIG. 8 is an enlarged plan view illustrating a portion "A" according to another exemplary embodiment in FIG. 2.

FIG. 8 is an enlarged plan view illustrating a portion "A" according to a fourth exemplary embodiment in FIG. 2. Particularly, a distance between the pixel electrodes is longer than an extending length of a drain extending part.

Referring to FIG. 8, the extending length L of the drain extending part DE-b may be shorter than the distance D between the first and second pixel electrodes 172 and 174 unlike FIG. 4.

When the extending length L is shorter than the distance D, the overlap avoiding portion 174a as shown in FIG. 4 may be not formed on an upper portion of the second pixel electrode 174 facing the first pixel electrode 172.

In another exemplary embodiment, even though the second pixel electrode 174 overlaps a portion of the TFT, the second pixel electrode 174 may not overlap the gate line 120. In an exemplary embodiment, the second pixel electrode 174 overlaps at least a portion of the source electrode SE, and does not overlaps the gate line 120. The second pixel electrode 174 may not overlap a portion of the gate line 120.

The array substrate of FIG. 8 is the same as the array substrate of FIGS. 4 and 5 except the above described. Thus, the same reference numerals will be used to refer to the same or like parts as those described in FIG. 6 and any further explanation concerning the above elements will be omitted.

Figure 9:
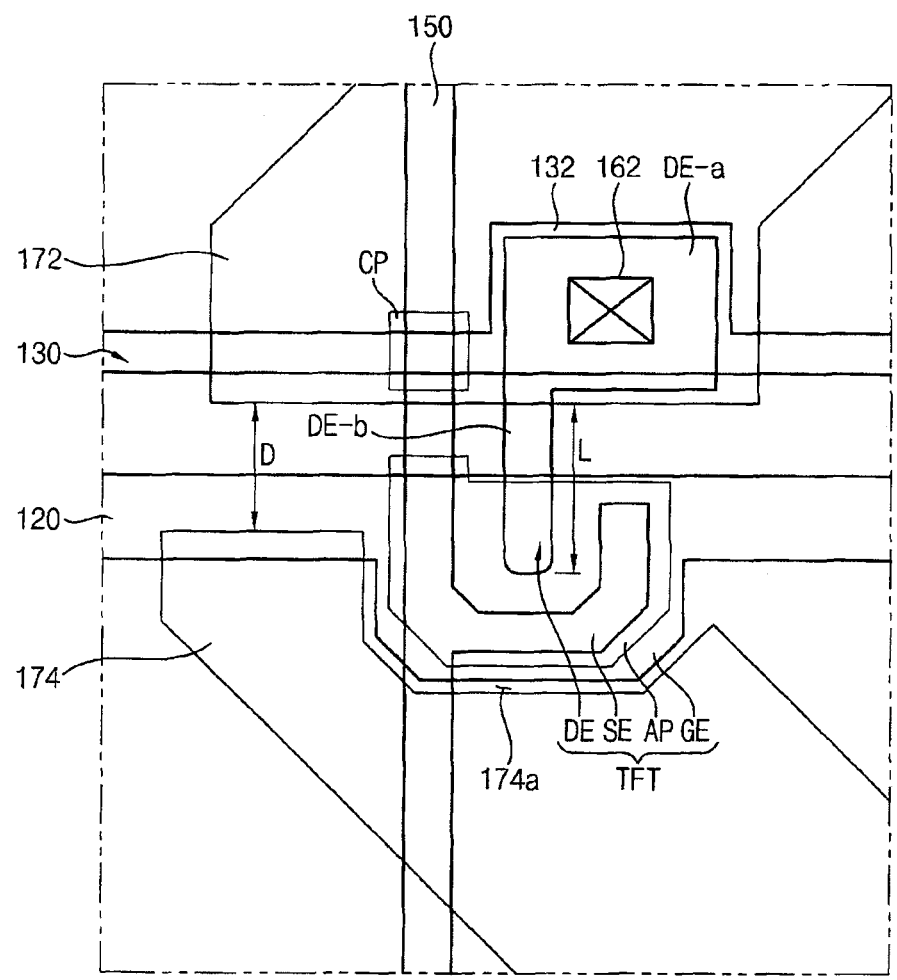
FIG. 9 is an enlarged plan view illustrating a portion "A" according to another exemplary embodiment in FIG. 2.

FIG. 9 is an enlarged plan view illustrating a portion "A" according to a fifth exemplary embodiment in FIG. 2. An overlap avoiding portion of the pixel electrode receives the TFT.

Referring to FIG. 9, the overlap avoiding portion 174a formed in the second pixel electrode 174 may have a size receiving all the TFT unlike FIG. 4.

In an exemplary embodiment, the overlap avoiding portion 174a may have a size receiving all the TFT not a size receiving the drain extending part DE-b. Thus, the second pixel electrode 174 does not overlap the TFT.

Even though the overlap avoiding portion 174a may have a different shape unlike FIG. 4, the second pixel electrode 174 may overlap a portion of the gate line 120.

The array substrate of FIG. 9 is same as the array substrate of FIGS. 4 and 5 except the above described. Thus, the same reference numerals will be used to refer to the same or like parts as those described in FIG. 6 and any further explanation concerning the above elements will be omitted.

Even though the second pixel electrode 174 is overlapped with a portion of the TFT, the second pixel electrode 174 does not overlap the drain extending part DE-b. Therefore, when the second voltage is applied to the second pixel electrode 174, stability of the first voltage charged in the first pixel electrode 172 may be increased.

In an exemplary embodiment, a coupling that the second voltage affects the first voltage is increased, which is generated between the first and second pixel electrodes 172 and 174, when the first and second voltages are different from each other. However, when the first and second voltages have the different voltage in the array substrate 100, stability of the first voltage charged in the first pixel electrode 172 is increased.

As described above, even though a portion of the TFT is overlapped with the second pixel electrode, the drain electrode does not overlap the second pixel electrode. Therefore, the coupling generated between the first and second pixel electrodes is prevented, so that a display quality may be enhanced.

Although the exemplary embodiments of the present invention have been described herein with reference with the accompanying drawings, it is understood that the present invention is not limited to these exemplary embodiments, and that various other changes and modifications can be affected therein by one of ordinary skilled in the related art without departing from the scope or spirit of the invention. All such changes and modifications are intended to be included within the scope of the invention as defined by the appended claims.

What is claimed is:

1. An array substrate comprising:
a gate line formed along a first direction;
a data line formed along a second direction crossing the first direction;
first and second pixel electrodes spaced apart from each other; and
a thin-film transistor (TFT) including a gate electrode connected to the gate line, a source electrode connected to the data line and partially overlapping the second pixel electrode in a plan view, and a drain electrode connected to the first pixel electrode and spaced apart from the second pixel electrode along the second direction.

2. The array substrate of claim 1, wherein drain electrode comprises:
   a pixel overlapping part overlapping the first pixel electrode to be electrically connected to the first pixel electrode; and
   a drain extending part extended to the second direction from the pixel overlapping part to face the source electrode.

3. The array substrate of claim 2, wherein an extending length of the drain extending part is longer than a distance between the first and second pixel electrodes.

4. The array substrate of claim 3, wherein an overlap avoiding portion for receiving an end portion of the drain extending part is formed at a first end portion of the second pixel electrode facing the first pixel electrode.

5. The array substrate of claim 2, wherein an extending length of the drain extending part is shorter than a distance between the first and second pixel electrodes.

6. The array substrate of claim 2, further comprising a storage line formed along the first direction to overlap the first pixel electrode.

7. The array substrate of claim 6, wherein the storage line comprises a drain overlapping part formed to overlap the pixel overlapping part.

8. The array substrate of claim 6, further comprising a cross area cover pattern formed between the storage line and the data line to cover a cross area of the storage line and the data line.

9. The array substrate of claim 1, wherein a first voltage is applied to the first pixel electrode, and a second voltage is greater than the first voltage and is applied to the second pixel electrode.

10. The array substrate of claim 1, wherein the source electrode comprises a U-shape or a J-shape.

11. The array substrate of claim 1, wherein the TFT comprises a gate electrode and an activation pattern formed between the source and drain electrodes to overlap the gate, source and drain electrodes, and the activation pattern covering an area where the gate pattern and the data line are crossed to each other.

12. The array substrate of claim 1, wherein the first and second pixel electrodes are formed to overlap the data lines.

13. The array substrate of claim 12, wherein each of the first and second pixel electrodes has a bent shape with an angle of about 90 degrees.

14. An array substrate comprising:
   a gate line formed along a first direction;
   a data line formed along a second direction crossing the first direction;
   first and second pixel electrodes spaced apart from each other along the second direction; and
   a thin-film transistor (TFT) including a gate electrode connected to the gate line, a source electrode connected to the data line, and a drain electrode connected to the first pixel electrode and spaced apart from the second pixel electrode along the second direction, wherein the TFT partially overlaps the second pixel electrode in plan view.

15. The array substrate of claim 14, wherein a portion of the gate line of the TFT partially overlaps the second pixel electrode.

16. An array substrate comprising:
   a plurality of gate lines formed along a first direction;
   a plurality of data lines formed along a second direction crossing the first direction;
   a first thin-film transistor electrically connected to a first gate line;
   a second thin-film transistor electrically connected to a second gate line, which is spaced apart from the first gate line in the second direction;
   a first pixel electrode electrically connected to a drain electrode of the first TFT; and
   a second pixel electrode connected to a drain electrode of the second TFT and partially overlapping the first gate line in a plan view and having a recess that has a shape receiving the drain electrode of the first TFT.

17. A display panel comprising:
   an array substrate including: a gate line formed along a first direction;
   a data line formed along a second direction crossing the first direction;
   first and second pixel electrodes spaced apart from each other; and
   a thin-film transistor (TFT) including a gate electrode connected to the gate line, a source electrode connected to the data line and partially overlapping the second pixel electrode in a plan view, and a drain electrode connected to the first pixel electrode and spaced apart from the second pixel electrode along the second direction, an opposite substrate opposite to the array substrate; and
   a liquid crystal layer interposed between the array substrate and the opposite substrate.

18. The display panel of claim 17, wherein the drain electrode comprises:
   a pixel overlapping part overlapping the first pixel electrode to be electrically connected to the first pixel electrode; and
   a drain extending part extending to the second direction from the pixel overlapping part to face the source electrode.

19. The display panel of claim 18, wherein an extending length of the drain extending part is longer than the distance between the first and second pixel electrodes, and an overlap avoiding portion for receiving an end portion of the drain extending part is formed at a first end portion of the second pixel electrode facing the first pixel electrode.

* * * * *